United States Patent
Heffington et al.

(10) Patent No.: US 7,768,779 B2
(45) Date of Patent: Aug. 3, 2010

(54) SYNTHETIC JET EJECTOR WITH VIEWING WINDOW AND TEMPORAL ALIASING

(75) Inventors: Samuel N. Heffington, Austin, TX (US); Michael D Wilcox, Austin, TX (US); Randall P. Williams, Austin, TX (US); Robert T. Reichenbach, Pflugerville, TX (US)

(73) Assignee: Nuventix, Inc., Austin, TX (US)

( * ) Notice: Subject to any disclaimer, the term of this patent is extended or adjusted under 35 U.S.C. 154(b) by 288 days.

(21) Appl. No.: 12/156,846

(22) Filed: Jun. 4, 2008

(65) Prior Publication Data
US 2008/0295997 A1    Dec. 4, 2008

Related U.S. Application Data

(60) Provisional application No. 60/933,185, filed on Jun. 4, 2007.

(51) Int. Cl.
*H05K 7/20* (2006.01)

(52) U.S. Cl. ............... 361/694; 361/690; 361/695; 361/703; 165/80.3; 165/104.33

(58) Field of Classification Search ............ None
See application file for complete search history.

(56) References Cited

U.S. PATENT DOCUMENTS

| | | | | |
|---|---|---|---|---|
| 6,123,145 A | * | 9/2000 | Glezer et al. | 165/104.33 |
| 6,937,472 B2 | * | 8/2005 | Pokhama | 361/700 |
| 7,204,615 B2 | * | 4/2007 | Arik et al. | 362/294 |
| 7,252,140 B2 | * | 8/2007 | Glezer et al. | 165/80.3 |
| 7,527,086 B2 | * | 5/2009 | Wang et al. | 165/104.31 |
| 2007/0272393 A1 | * | 11/2007 | Reichenbach et al. | 165/84 |
| 2009/0219686 A1 | * | 9/2009 | Ishikawa et al. | 361/692 |
| 2010/0018675 A1 | * | 1/2010 | Aarts et al. | 165/104.19 |

\* cited by examiner

*Primary Examiner*—Boris L Chervinsky
(74) *Attorney, Agent, or Firm*—John A. Fortkort; Fortkort & Houston P.C.

(57) ABSTRACT

A device (103) is provided which comprises (a) a housing (115) equipped with a viewing window (253); (b) a diaphragm (301), visible through said viewing window; (c) an actuator (126) adapted to vibrate said diaphragm at an operating frequency; and (d) a strobe light (121).

28 Claims, 19 Drawing Sheets

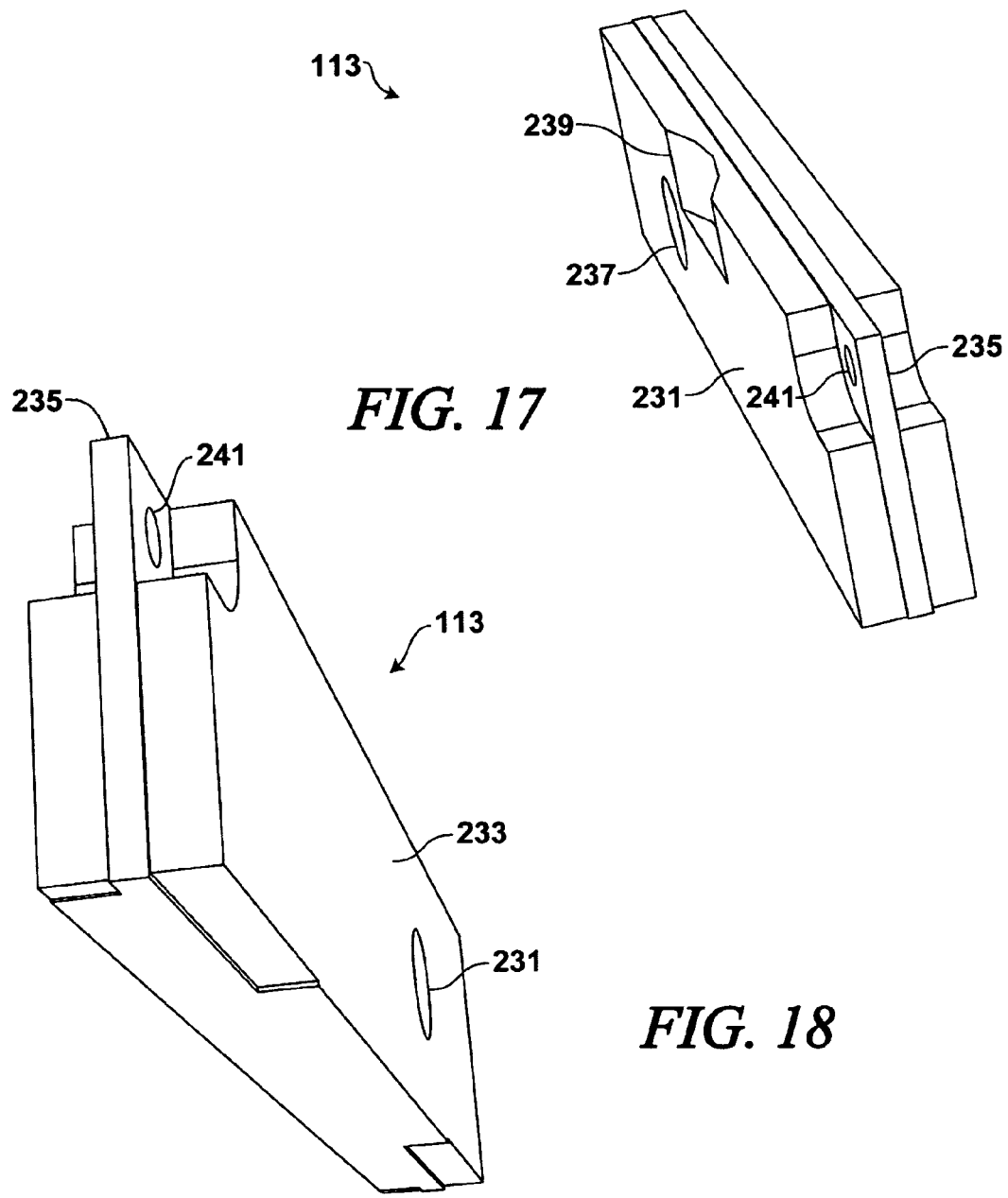

SYNTHETIC JET EJECTOR WITH VIEWING WINDOW AND TEMPORAL ALIASING

CROSS-REFERENCE TO RELATED APPLICATIONS

This application claims the benefit of priority to U.S. Provisional Application No. 60/933,185, filed Jun. 4, 2007, having the same inventors, and which is incorporated herein by reference in its entirety.

FIELD OF THE DISCLOSURE

The present invention relates generally to thermal management systems which utilize synthetic jet ejectors, and more specifically to thermal management systems of this type which are equipped with a means for observing the functioning of the synthetic jet actuator.

BACKGROUND OF THE DISCLOSURE

Various thermal management systems have been developed which utilize synthetic jet ejectors. Such systems are advantageous in that they offer higher energy efficiencies, improved heat transfer, a reduced acoustical footprint, and lower levels of electromagnetic interference as compared to many conventional fan-based thermal management systems. Systems of this type are described in greater detail, for example, in U.S. 2006/0196638 (Glezer et al.), "System and Method for Thermal management Using Distributed Synthetic Jet Actuators"; U.S. 2006/0185822 (Glezer et al.), "System and Method for Thermal management Using Distributed Synthetic Jet Actuators"; U.S. 2007/0096118 (Mahalingam et al.), "Synthetic Jet Cooling System for LED Module"; U.S. 2007/0081027 (Beltran et al.), "Acoustic Resonator for Synthetic Jet Generation For Thermal Management"; and U.S. Pat. No. 6,588,497 (Glezer et al.).

SUMMARY OF THE DISCLOSURE

In one aspect, a synthetic jet ejector, comprising (a) a housing equipped with a viewing window; (b) a diaphragm, visible through said viewing window; (c) an actuator adapted to vibrate said diaphragm at an operating frequency; and (d) a strobe light.

In another aspect, a device is provided which comprises a synthetic jet actuator module comprising (a) a synthetic jet actuator equipped with an actuator and a diaphragm, (b) a window, and (c) a strobe light; and a payload module comprising a rail which is in fluidic communication with said synthetic jet actuator.

In a further aspect, a device is provided which comprises (a) a synthetic jet actuator module equipped with first and second synthetic jet ejectors having first and second diaphragms, respectively; (b) a payload module comprising first and second structural elements having first and second interior spaces therein, respectively, wherein said first interior space is in fluidic communication with said first synthetic jet actuator, and wherein said second interior space is in fluidic communication with said second synthetic jet actuator; (c) a transparent panel disposed over said first and second diaphragms; (d) first and second window frames, seated on said transparent panel over said first and second diaphragms, respectively, wherein each of said first and second window frames has an aperture in a sidewall thereof; (e) a first strobe light; (f) a first holder adapted to hold said first strobe light adjacent to the aperture of said first window frame; and (g) an opaque first exterior housing element seated over said transparent panel and having a first aperture therein into which said first window frame protrudes.

BRIEF DESCRIPTION OF THE DRAWINGS

FIG. 17 is a perspective view of the card of the synthetic jet actuator module of FIG. 7;

FIG. 18 is a perspective view of the card of the synthetic jet actuator module of FIG. 7;

DETAILED DESCRIPTION

Figure 1:
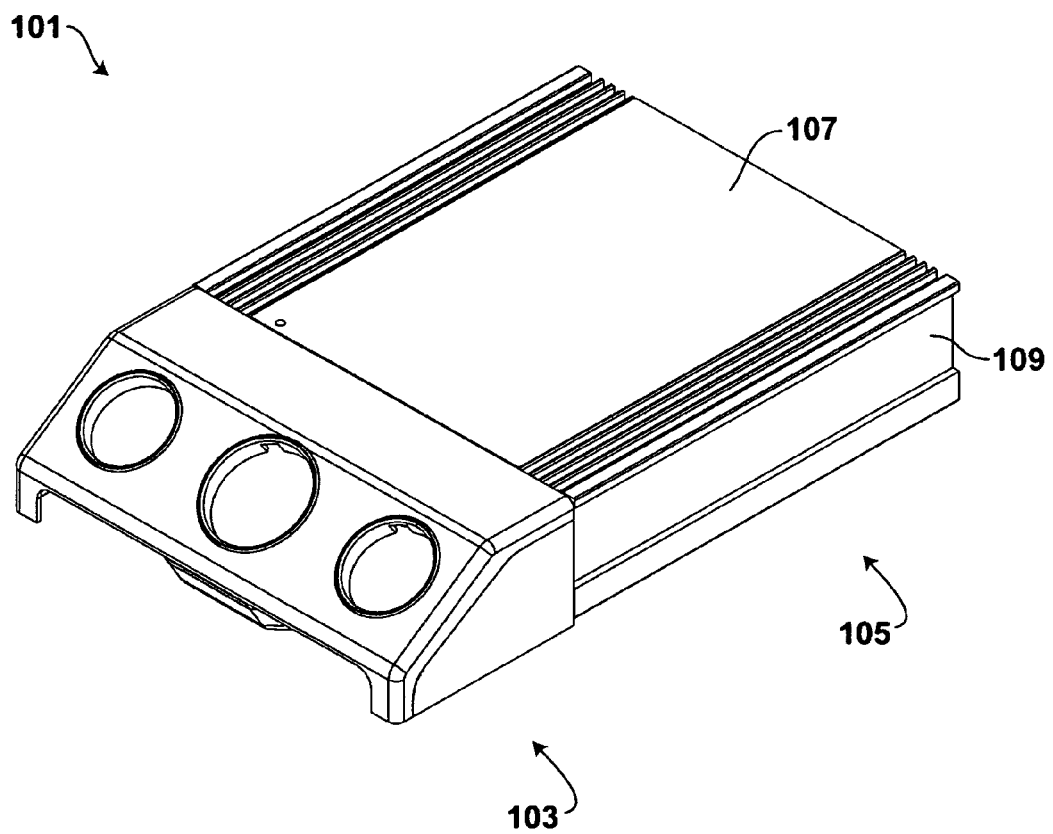
FIG. 1 is a perspective view of a device equipped with a thermal management system of the type described herein.

Despite their many advantages, the use of synthetic jet ejectors also poses some notable challenges. For example, synthetic jet ejectors are frequently incorporated into devices where the functioning of the synthetic jet ejector is hidden from view. However, many of the desirable attributes of a synthetic jet ejector require that the diaphragm within the device vibrates properly and within a given frequency range. Consequently, if problems develop with the synthetic jet ejector, they must often be deduced from indirect observations, such as overheating of the host device. Moreover, even if the synthetic jet ejector itself is directly observable, the frequency at which the diaphragm typically vibrates is too fast for direct visible observation.

There is thus a need in the art for a means by which a synthetic jet ejector which is incorporated into a host device may be directly observed. There is further a need in the art for a means by which the motion of the diaphragm within a synthetic jet ejector may be visibly ascertained. These and other needs may be addressed with the devices and methodologies disclosed herein.

It has now been found that the aforementioned needs may be addressed through the use of temporal aliasing, in conjunction with a viewing window built into a wall of the host device. "Temporal aliasing" refers to the visual phenomenon which occurs when continuous motion is represented by a series of short or instantaneous samples. Temporal aliasing typically occurs when the view of a moving object is represented by a series of short, non-continuous samples, and when the moving object is moving at a cyclical or rotational speed which is sufficiently close to the sampling rate. One well known example of this phenomenon is the so-called "wagon-wheel effect" which occurs frequently in video or motion pictures, and which can cause the spokes on wagon wheels, automobile hub caps and other such devices to appear to be rotating backwards. The wagon wheel effect occurs in part because the finite number of frames per second present in film media is precisely the type of non-continuous sampling which can give rise to temporal aliasing.

Temporal aliasing is also known as the "stroboscopic effect", since the phenomenon may be reproduced by flashing a strobe light on an object which is in cyclic motion. If the strobe light is operating at a sufficiently high frequency, and if the frequency of the strobe light is identical to, or is an integer multiple of, the frequency at which the object is moving, the object will appear to be stationary, since the visual sampling of the object by the viewer's eyes will then be occurring at the same point in the cycle. The motion of the object may also be made to appear to move backwards or forwards in its cycle by adjusting the frequency of the strobe light to higher or lower values, respectively. Typically, the strobe light must be operated at a frequency of at least 60 flashes per second in order for the persistence of human vision to smooth out the sequence of flashes so that the perceived image is continuous.

It has now been found that temporal aliasing may be utilized as a convenient means for providing a visual indication of the proper functioning of a synthetic jet ejector. This may be accomplished, for example, by providing a viewing window built into the housing of a synthetic jet ejector (or built into the housing of a host device incorporating the synthetic jet ejector) which is equipped with one or more strobe lights. The strobe lights may then be operated at a sufficient frequency such that temporal aliasing creates the visual illusion of slowing down the motion of the membrane of the actuator such that the complete vibrational cycle of the membrane may be observed. Consequently, any significant aberrations in the motion of the membrane will be visually apparent to the user of the device. Aside from its functional use, this approach also lends visual interest to the device incorporating the synthetic jet ejector, and provides the user of the device with visual confirmation that the synthetic jet ejector is operating properly.

FIGS. 1-20 illustrate a first particular, non-limiting embodiment of a device equipped with a viewing window in accordance with the teachings herein. With reference to FIG. 1, the device 101 comprises a synthetic jet actuator module 103 and a payload module 105.

Figure 2:
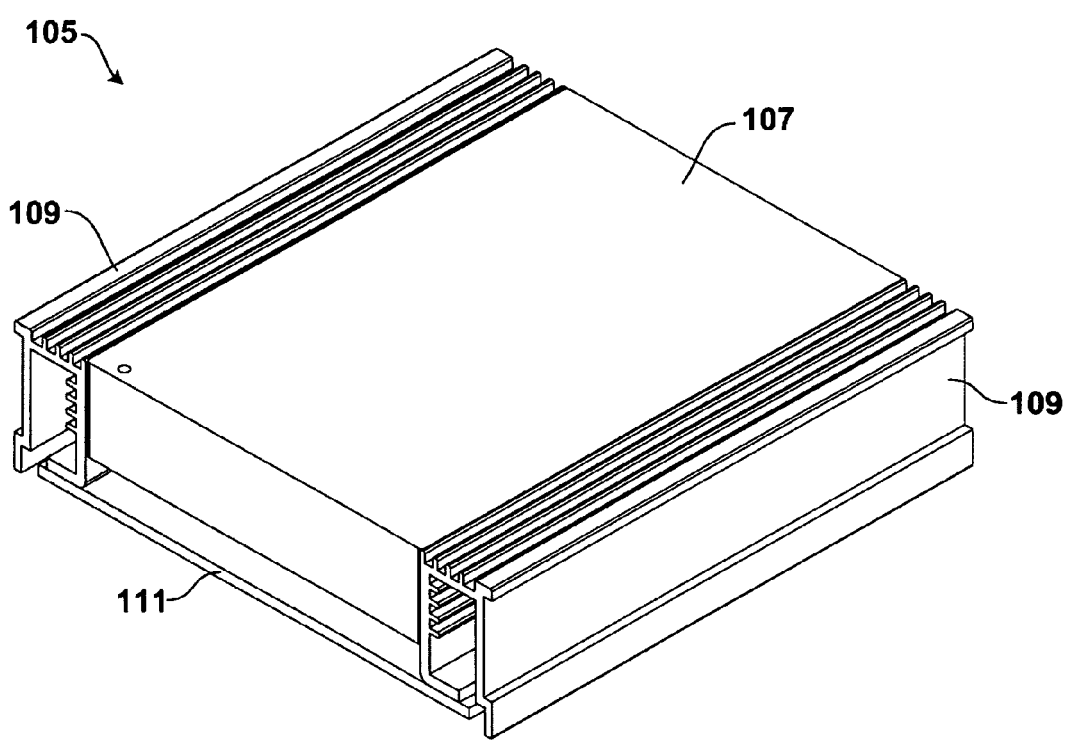
FIG. 2 is a perspective view of the payload component of the device of FIG. 1.
Figure 3:
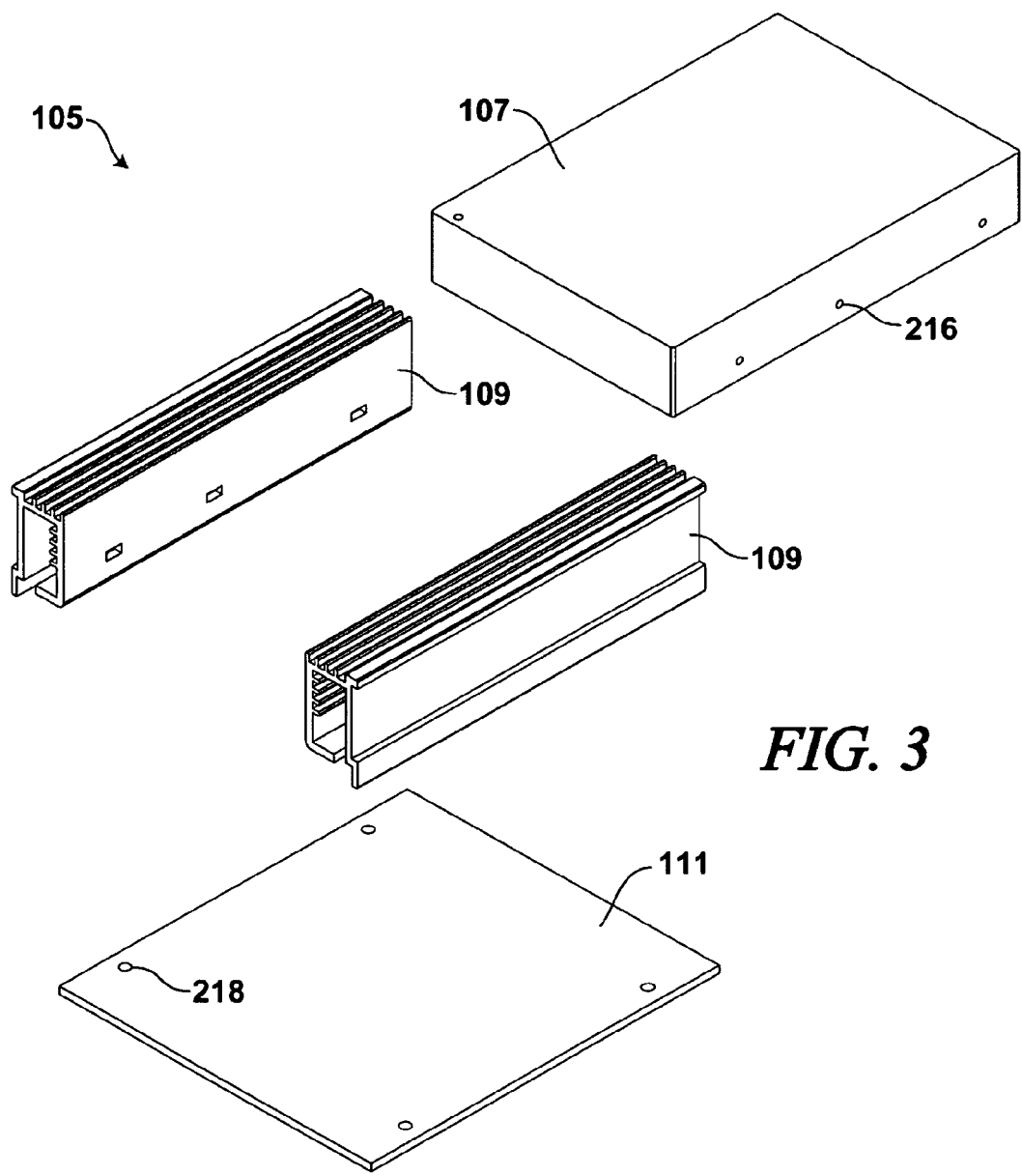
FIG. 3 is an exploded view of the payload component of FIG. 2.

The payload module 105 is shown in greater detail in FIG. 2 and in the exploded view thereof shown in FIG. 3. As seen therein, the payload module 105 in this particular embodiment comprises an external hard disk drive 107 which is bounded on the sides by first and second rails 109, and which is seated on a heat sink plate 111. It will be appreciated, however, that a wide variety of devices which require thermal management may be used in place of the hard disk drive 107, and hence the use of a hard disk drive here is for illustrative purposes and is not intended to be limiting. It will also be appreciated that the geometry or design of the rails 109 or enclosure may be modified to accommodate the device in question.

Figure 4:
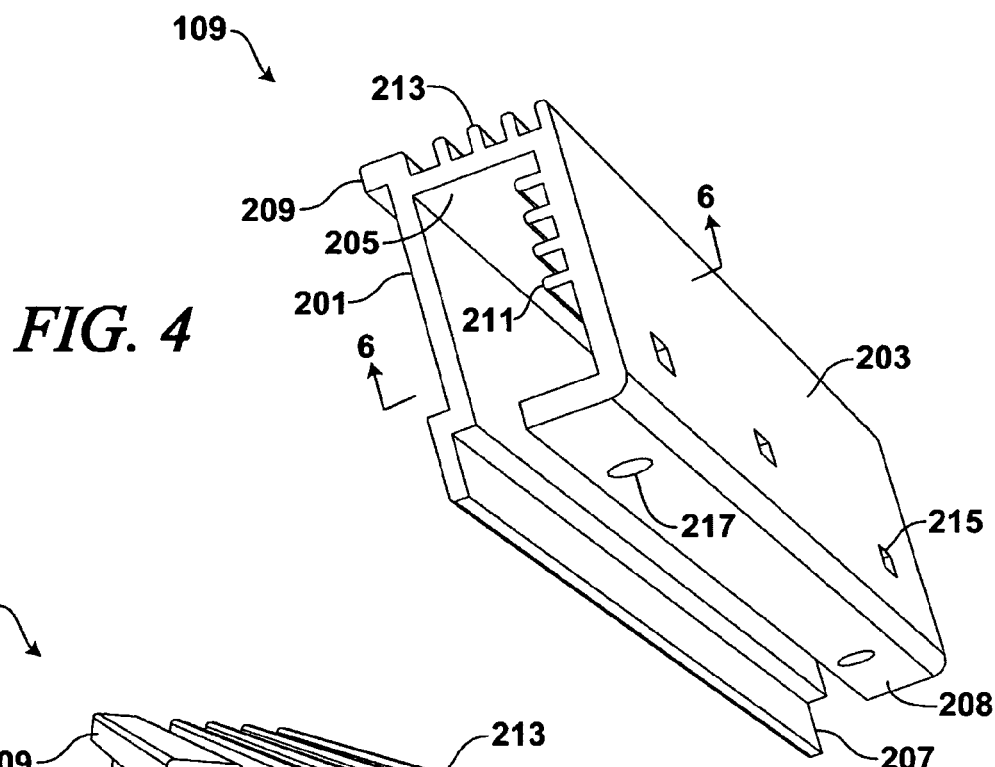
FIG. 4 is a perspective view of a rail of the payload component of FIG. 2.
Figure 5:
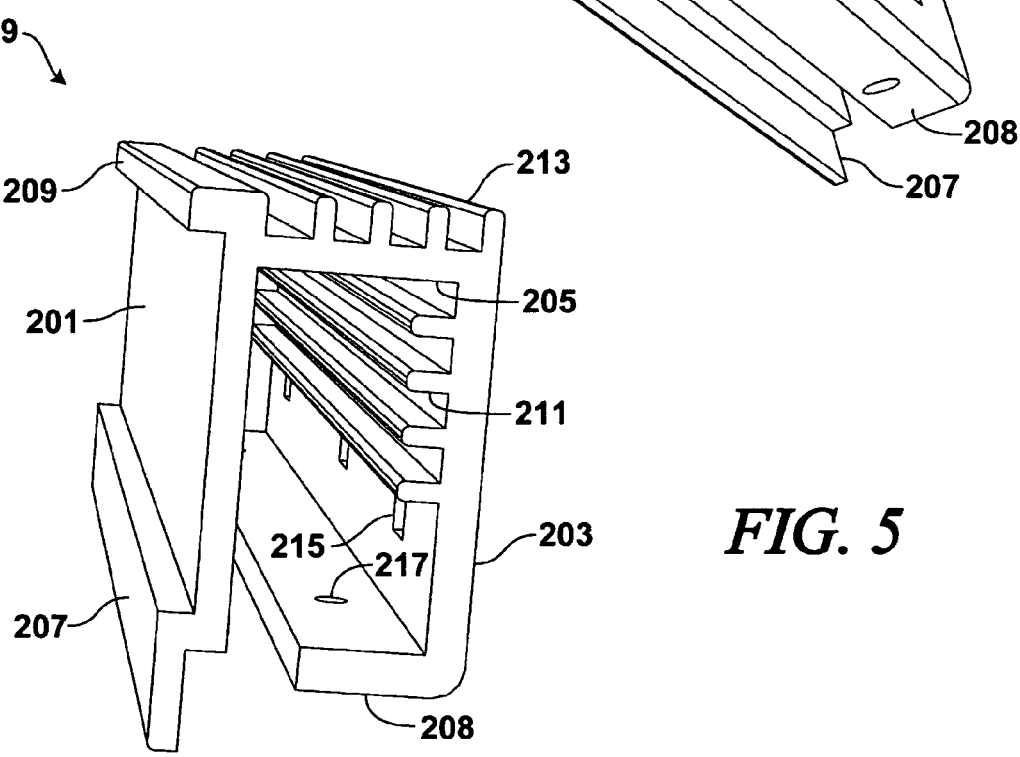
FIG. 5 is a perspective view of a rail of the payload component of FIG. 2.
Figure 6:
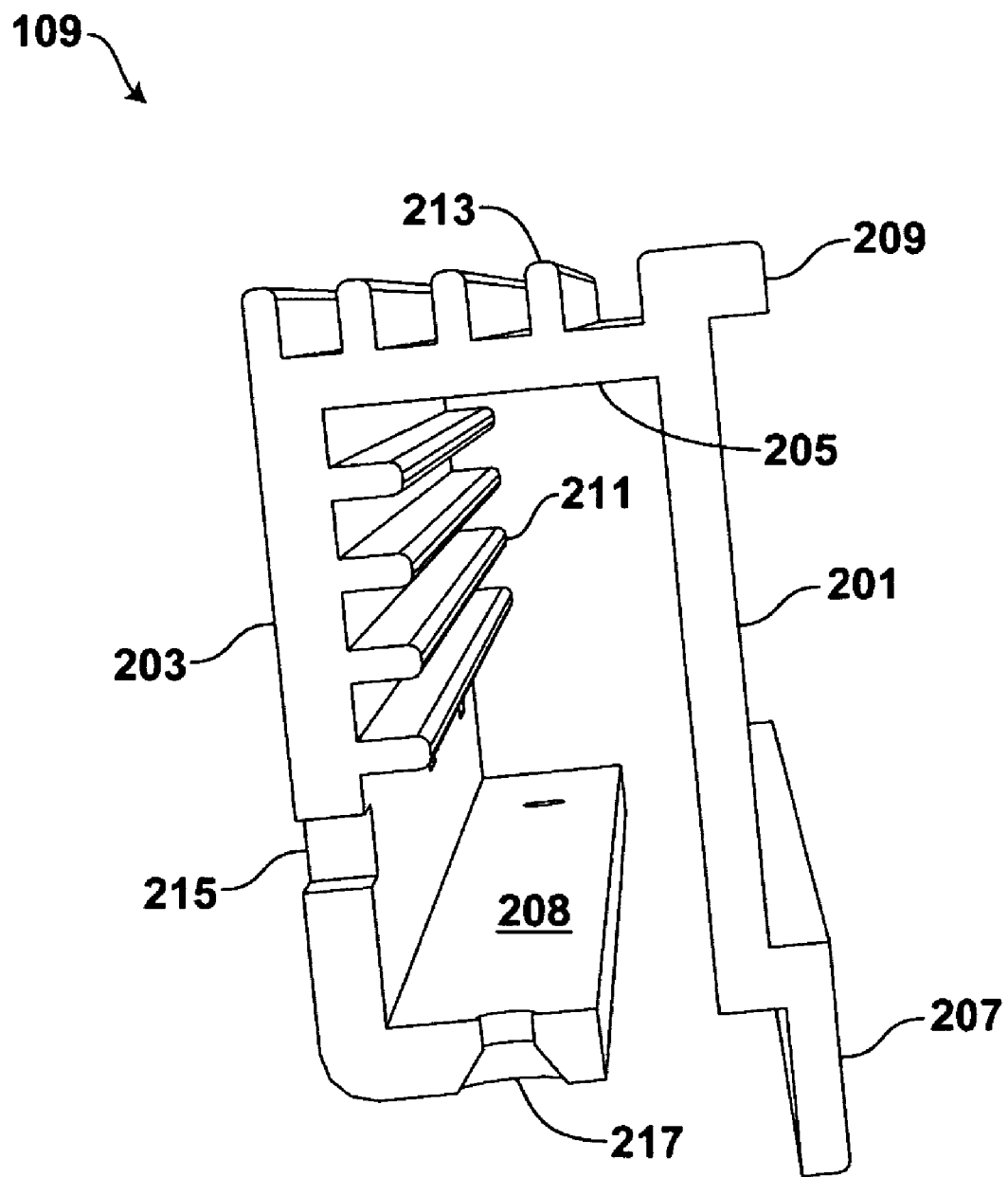
FIG. 6 is a cross-sectional view taken along LINE 6-6 of FIG. 4.

The rails 109 are shown in greater detail in FIGS. 4-6. As seen therein, each of the rails 109 is equipped with a set of apertures 215 which are provided in sidewalls 203 thereof, and through which the rails 109 may be attached laterally to the housing of the hard disk drive 107 through the use of suitable fasteners (not shown). A corresponding set of apertures 216 (see FIG. 3) are also provided in the side walls of the hard disk drive 107 for this purpose. Similarly, a set of apertures 217 are provided in a bottom wall 208 of the rails 109 by which the rails 109 may be fastened to the heat sink plate 111 by way of apertures 218 (see FIG. 3).

Each rail 109 is provided with a first lip 207 on a first sidewall 201 thereof which is complimentary in shape to the edge of the heat sink plate 111, and is also provided with a second lip 208 on a second sidewall 203 thereof which is parallel to a major surface of the heat sink plate 111. The first 207 and second 208 lips allow for easier alignment of the apertures 217 of the rail 109 with the apertures 218 of the heat sink plate 111, provide a sturdier attachment of the two surfaces, and ensure proper vertical alignment of the rails 109.

Each of the rails 109 is also equipped with a first set of heat fins 211 disposed on the interior of the second sidewall 203 of the rail 109, and a second set of heat fins 213 disposed on the exterior surface of the top wall 205 of the rail 109. The first 211 and second 213 sets of heat fins allow the rail 109 to dissipate heat to the external environment more rapidly and efficiently. When the device 101 is in use, one or more synthetic jets are directed along the length of the interior of each of the rails, and preferably such that a synthetic jet is directed between one or more pairs of adjacent heat fins 211 in the first set of heat fins. The second set of heat fins 213 is exposed to the ambient environment. In some embodiments, one or more synthetic jets may also be directed between one or more pairs of adjacent heat fins in the second set of heat fins 213.

Figure 10:
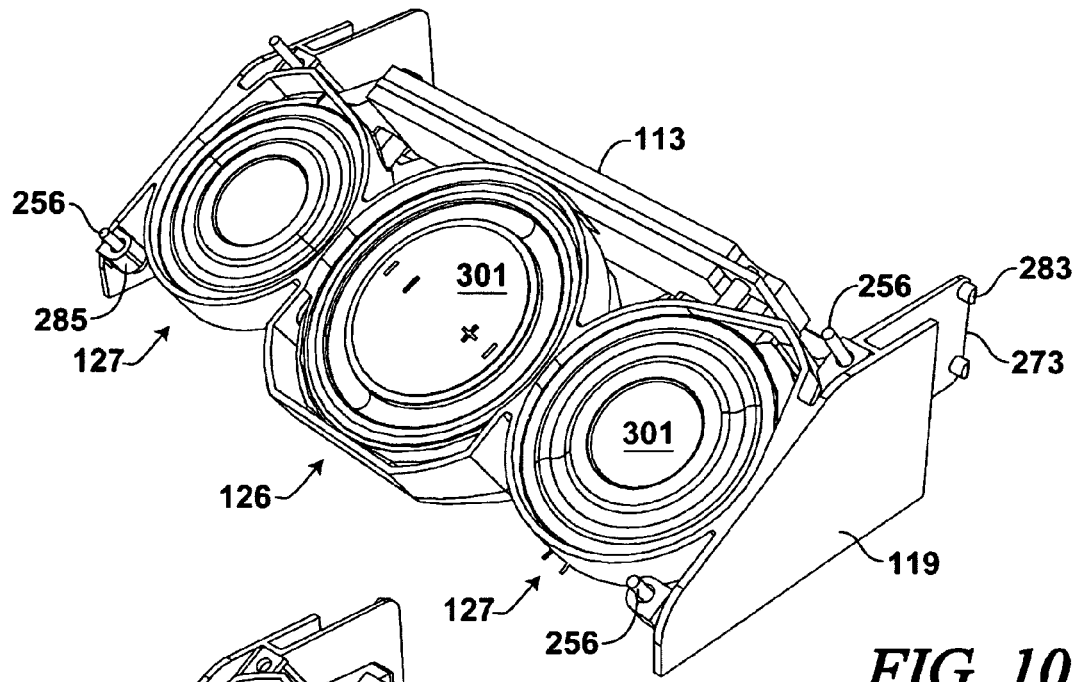
FIG. 10 is a perspective view of FIG. 9 with the transparent substrate removed.
Figure 11:
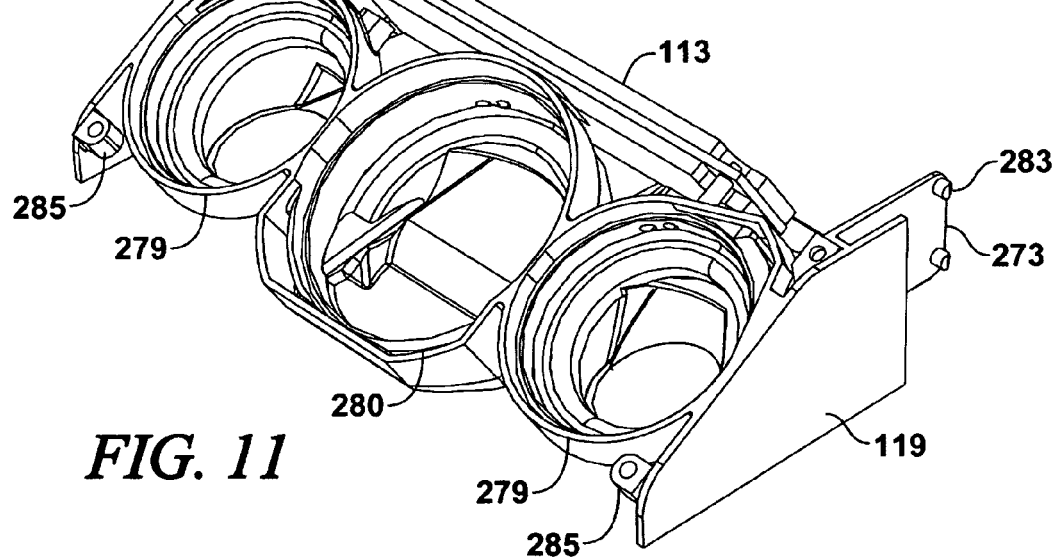
FIG. 11 is a perspective view of FIG. 10 with the actuator assemblies removed.
Figure 12:
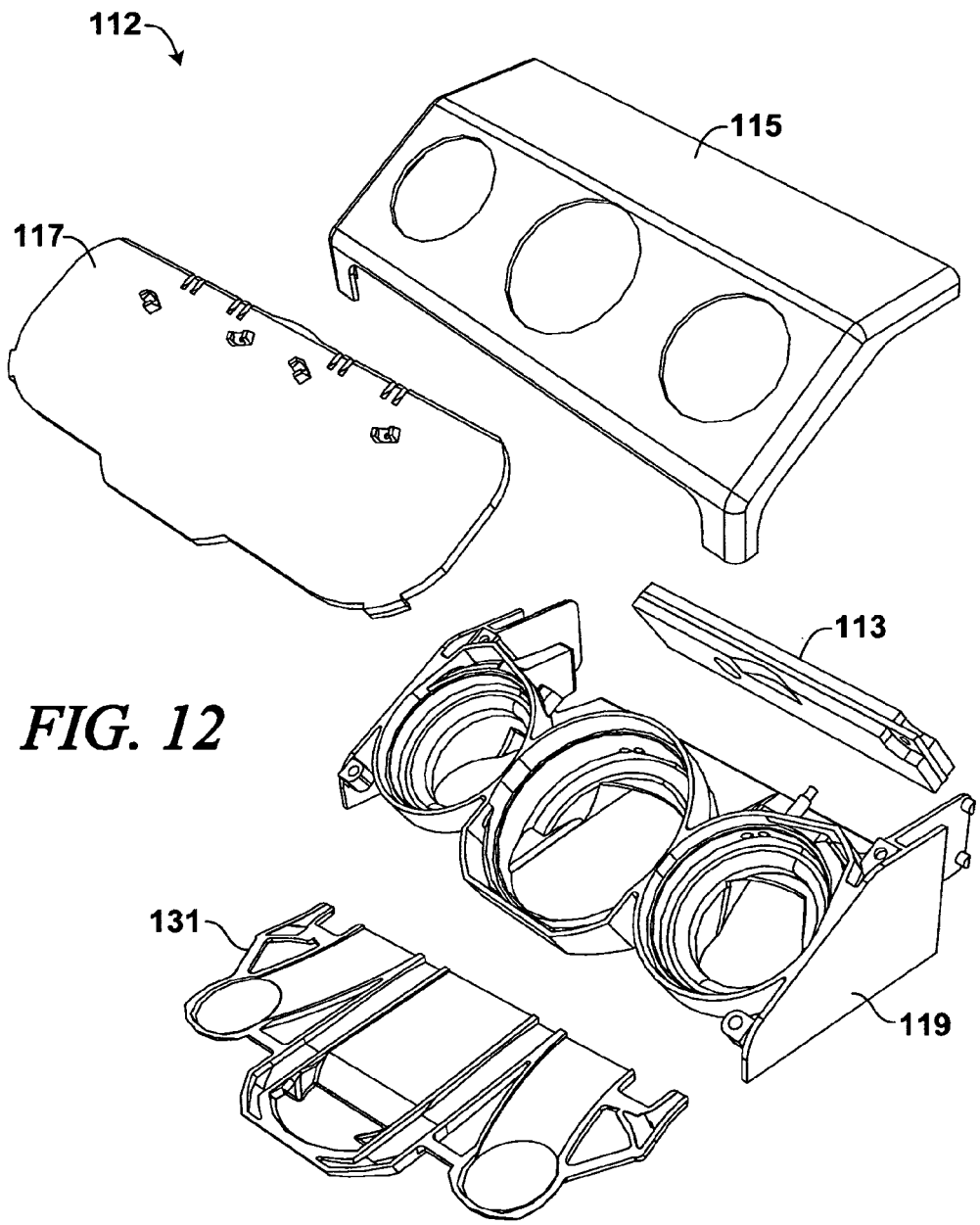
FIG. 12 is a perspective view of the main chassis components of the synthetic jet actuator module of FIG. 7.
Figure 13:
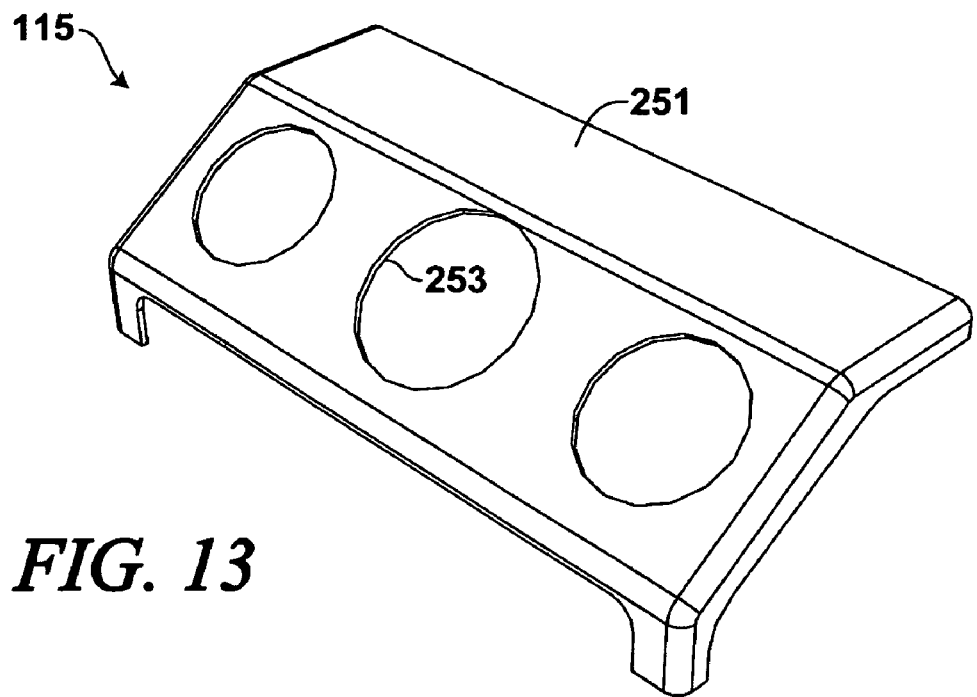
FIG. 13 is a perspective view of the panel component of the synthetic jet actuator module of FIG. 7.

The details of the synthetic jet ejector module 103 may be appreciated with respect to FIGS. 7-12. As seen therein, the synthetic jet ejector module 103 consists primarily of first 126 and second 127 groups of synthetic jet ejector assemblies (see FIG. 10) and a variety of chassis elements (see FIG. 12), along with the circuitry and wiring necessary for the device to operate. As best seen in FIG. 12, the chassis elements 112 include a panel 115, a transparent substrate 117, a main body element 119, a lower body element 131, and a control card 113.

Figure 7:
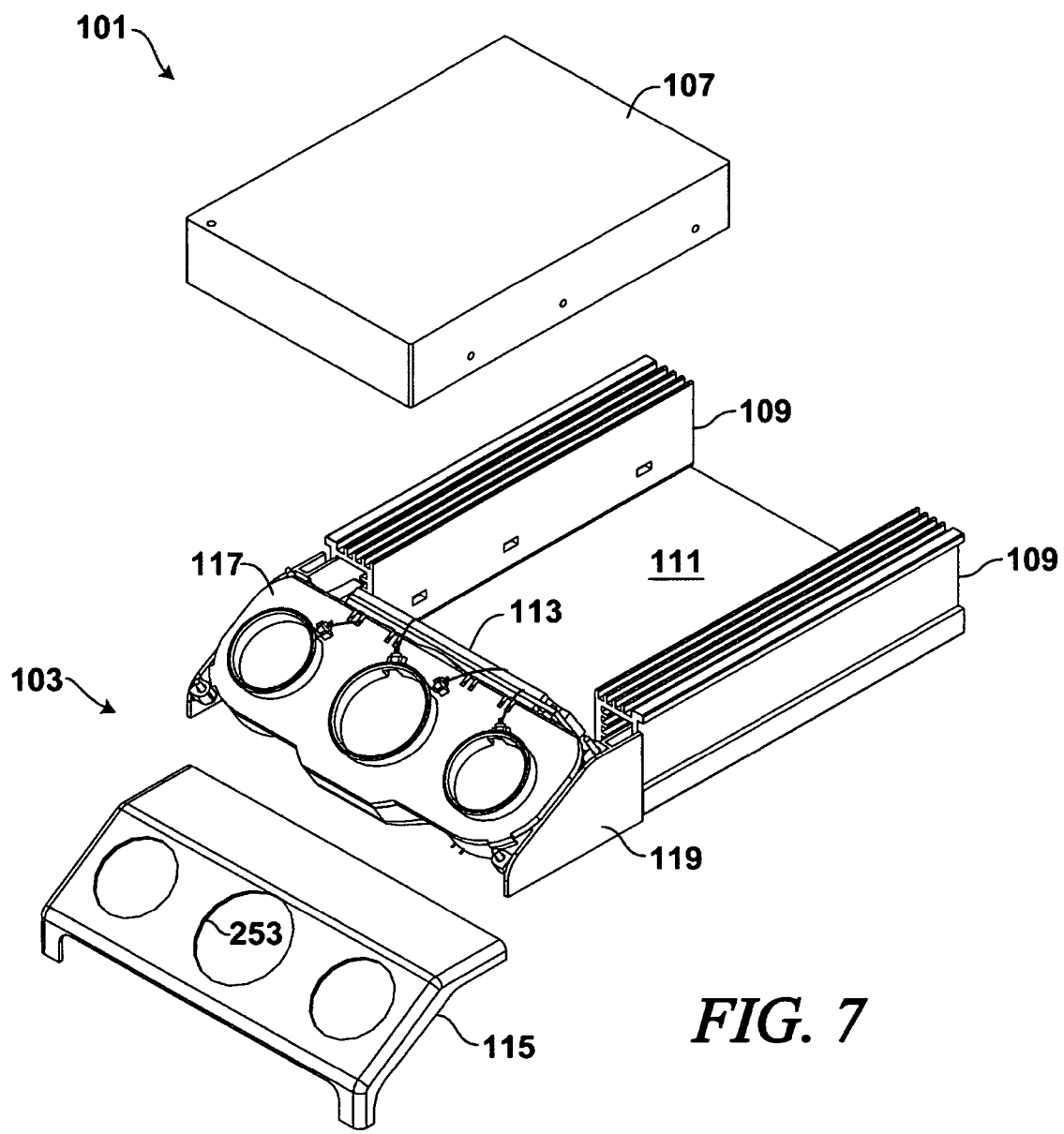
FIG. 7 is a partially exploded view of FIG. 1.
Figure 8:
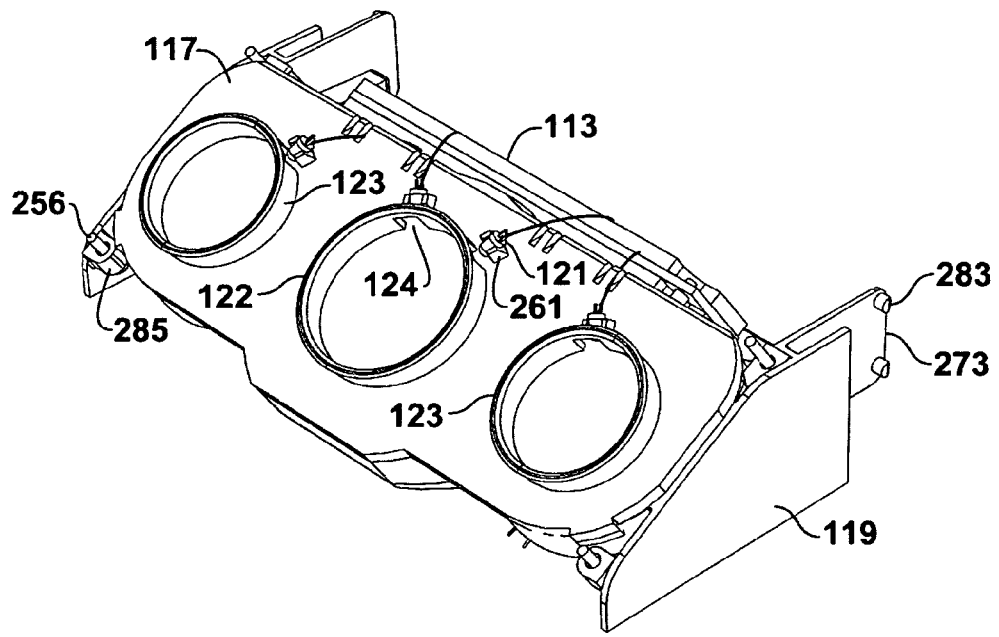
FIG. 8 is a perspective view of the synthetic jet actuator module of FIG. 7 with the panel removed.
Figure 9:
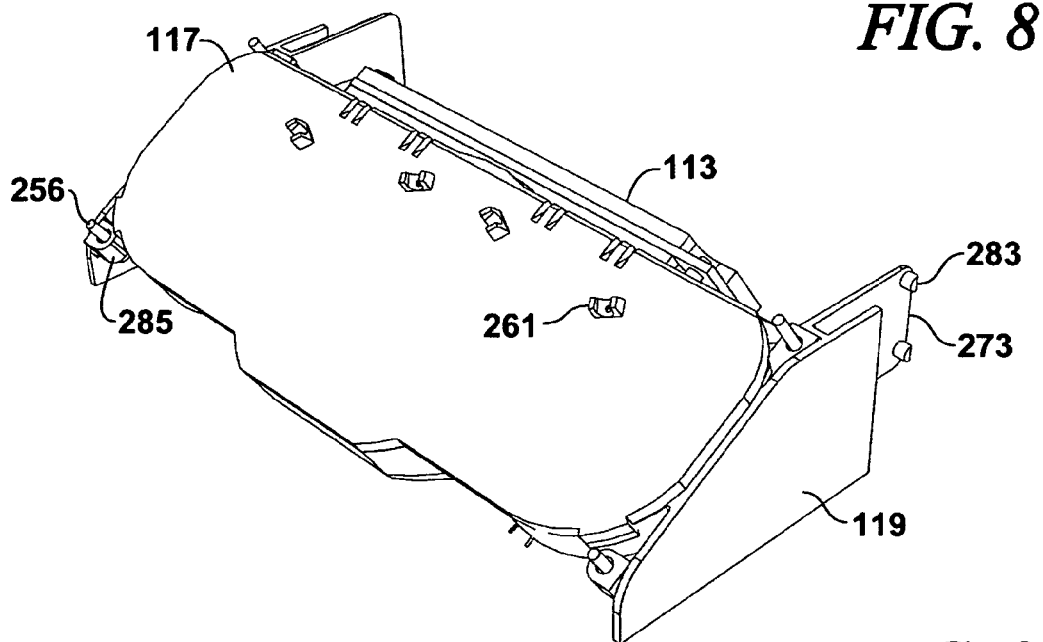
FIG. 9 is a perspective view of FIG. 8 with the LED assembly removed.

Referring now to FIGS. 7-8, the upper portion of the synthetic jet ejector module 103 comprises a substrate 117 which is preferably transparent and upon which are seated first 122 and second 123 sets of window frames (see FIG. 8). The first set of window frames 122 in this particular embodiment comprises a central window frame, and the second set of window frames 123 comprises peripheral window frames. The first 122 and second 123 sets of window frames are held in place by panel 115, which is equipped with complimentary shaped openings 253 (see FIG. 7) through which the window frames 122, 123 protrude.

Figure 14:
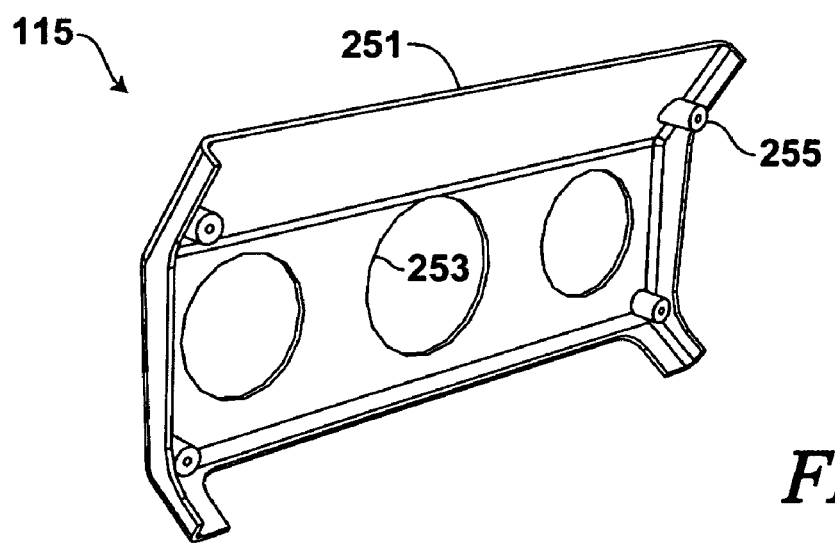
FIG. 14 is a perspective view of the panel component of the synthetic jet actuator module of FIG. 7.
Figure 15:
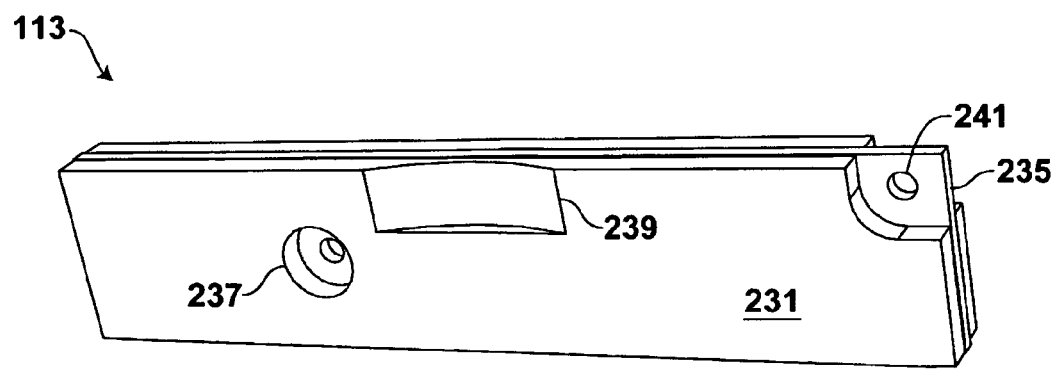
FIG. 15 is a perspective view of the card of the synthetic jet actuator module of FIG. 7.
Figure 16:
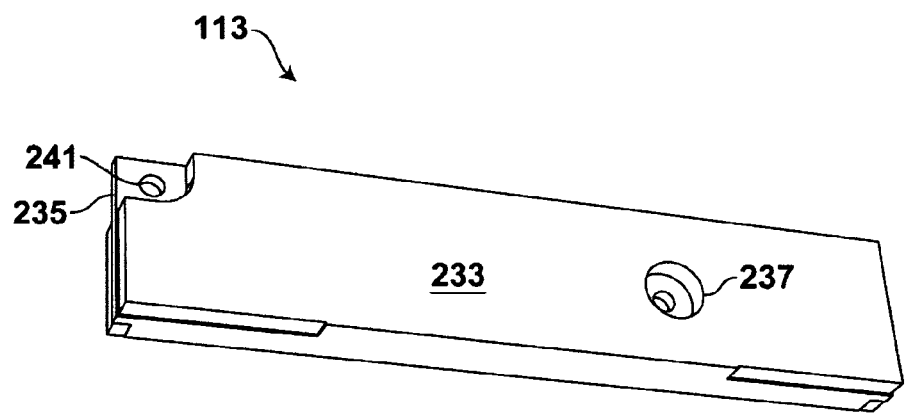
FIG. 16 is a perspective view of the card of the synthetic jet actuator module of FIG. 7.

As seen in FIG. 14, the panel 115 is equipped with a series of hollow protrusions 255 which, during assembly, releasably engage a corresponding series of complimentary shaped pegs 256 (see FIGS. 8-11) provided in the main body element 119, thereby securing the panel 115 to the main body element 119 and holding the window frames 122, 123 in place. The pegs 256 extend from a series of protrusions 285 arranged about the periphery of the main body element 119.

Figure 30:
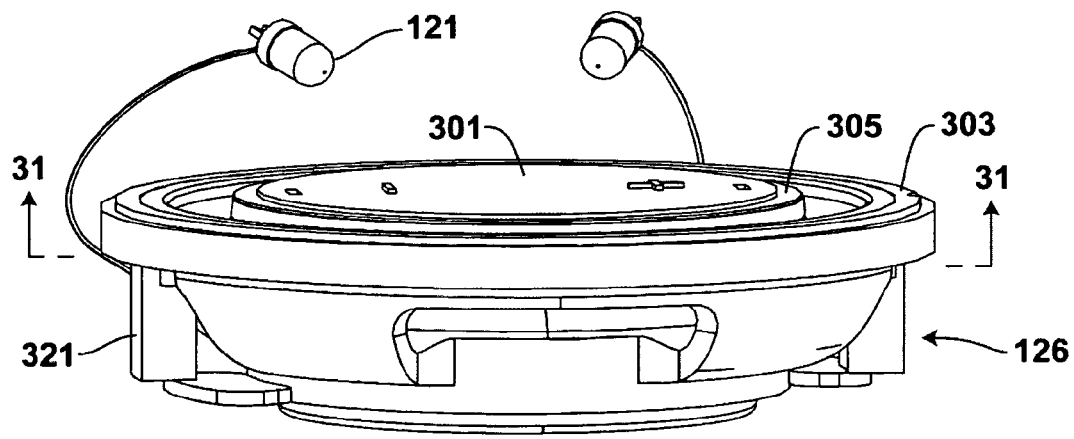
FIG. 30 is a perspective view of the synthetic jet actuator of FIG. 10, and showing the orientation of the light source to the diaphragm.

As seen in FIG. 8, each of the window frames 122, 123 is equipped with an aperture 124 along a sidewall thereof. The substrate 117 is equipped with a plurality of clips 261 (see FIGS. 8-9) adjacent to these apertures 124, each of which is adapted to maintain a light source 121 (preferably an LED light with appropriate wiring attached) in an appropriate orientation (best seen in FIG. 30) with respect to the substrate 117 such that the light source 121 illuminates the interior of the window frames 122, 123 and the underlying diaphragms 301 (see FIG. 10) of the synthetic jet actuators 126, 127. The clips 261 serve the further purpose of maintaining the panel 115 in a proper, spaced-apart relation with respect to the substrate 117.

As seen from FIGS. 8 and 10, the first 122 and second 123 sets of window frames are positioned directly over the first 126 and second 127 sets of synthetic jet ejector assemblies, respectively, such that the light from the light source 121 illuminates the diaphragm 301 of each assembly. Hence, when the device 101 is in operation and the diaphragms 301 are vibrating at a first frequency, the light source may be operated in a stroboscopic fashion at an appropriate second frequency such that temporal aliasing occurs. If the second frequency (which may be the same or different for each of the diaphragms) is chosen properly, temporal aliasing will allow the motion of the diaphragms to be readily observed, and any aberrations in that motion will be readily apparent to the naked eye.

Figure 19:
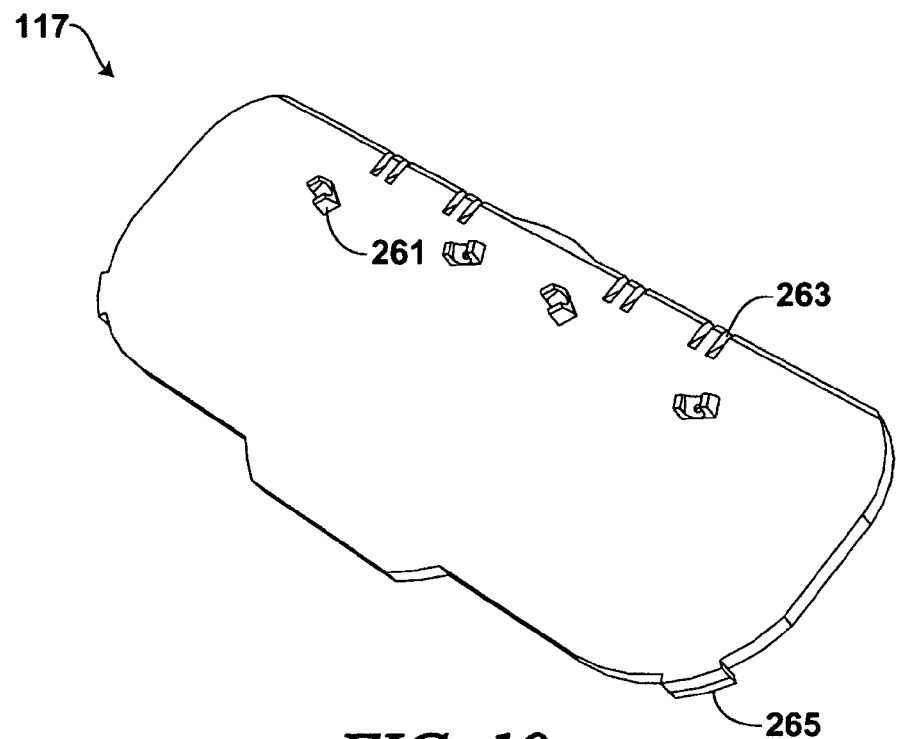
FIG. 19 is a perspective view of the transparent substrate of the synthetic jet actuator module of FIG. 7.
Figure 20:
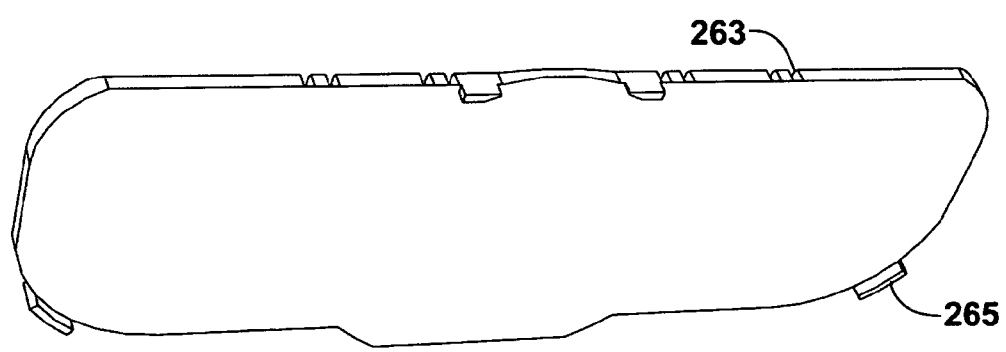
FIG. 20 is a perspective view of the transparent substrate of the synthetic jet actuator module of FIG. 7.

The substrate 117 is shown in greater detail in FIGS. 19-20. As seen therein, the top surface of the substrate 117 is provided with clips 261 to maintain the light sources 121 (see FIG. 8) in a proper orientation with respect to the diaphragm 301 of the synthetic jet actuator 126, 127 (see FIG. 30). The bottom surface of the substrate 117 is provided with a plurality of flanges 265 for releasably securing it to the main body element 119.

Figure 21:
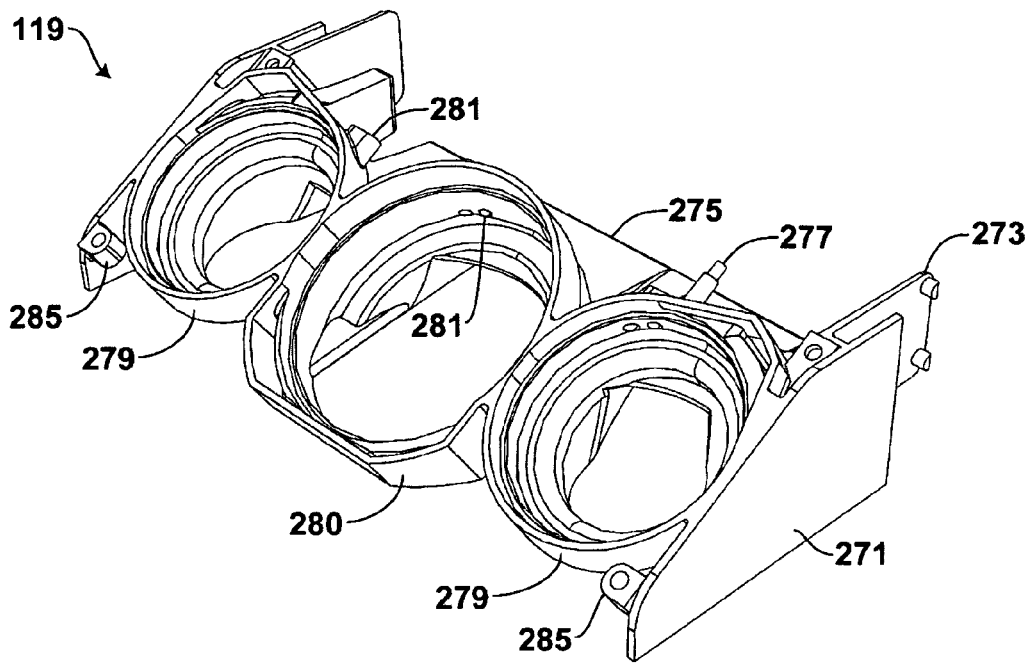
FIG. 21 is a front perspective view of the middle housing element of the synthetic jet actuator module of FIG. 7.
Figure 22:
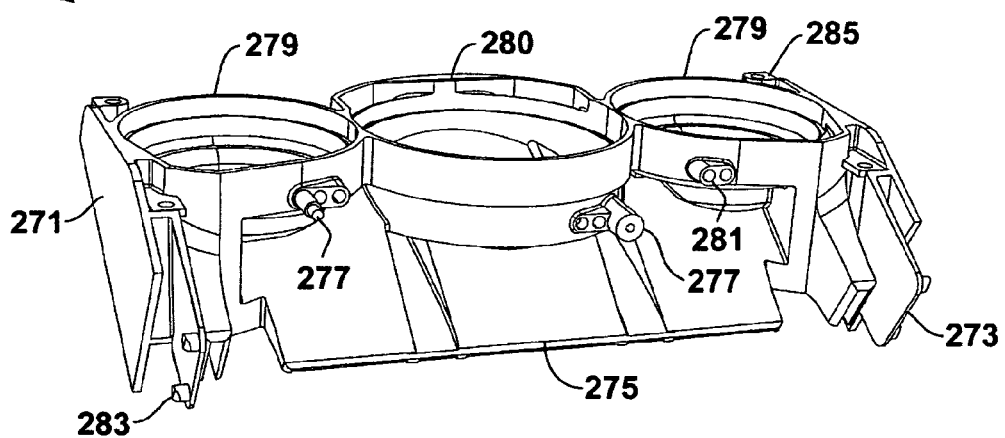
FIG. 22 is a rear perspective view of the middle housing element of the synthetic jet actuator module of FIG. 7.
Figure 23:
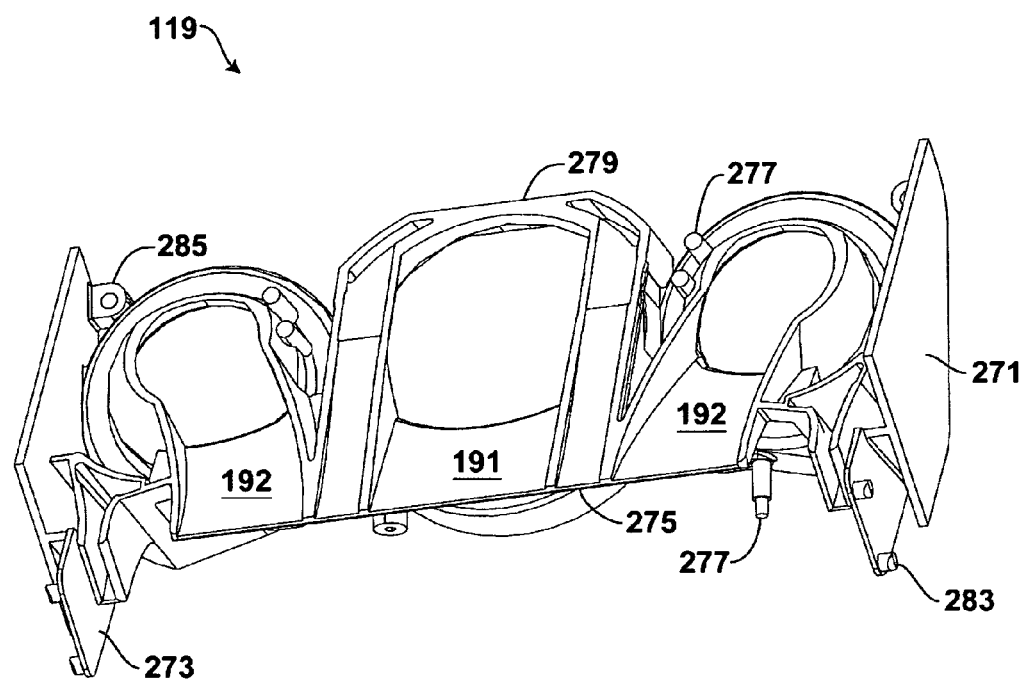
FIG. 23 is a bottom perspective view of the middle housing element of the synthetic jet actuator module of FIG. 7.

The main body element 119 is shown in greater detail in FIGS. 10-11 and in FIGS. 21-23. As best seen in FIG. 11, the main body element 119 is equipped with a plurality of apertures 279, 280 which seat the first 126 and second 127 sets of synthetic jet actuators, respectively. Notably, the central aperture 280 has a larger diameter than the peripheral apertures 279. This is because, in the preferred embodiment, the mass of the diaphragm of the central synthetic jet ejector 126 is essentially twice the mass of the peripheral synthetic jet ejectors 127. As a consequence, vibration and noise reduction may be achieved by operating the central synthetic jet ejector 126 in an out-of-phase manner with respect to the peripheral synthetic jet ejectors 127. Of course, it will be appreciated that various embodiments are possible in accordance with the teachings herein wherein the mass of the diaphragms may be distributed over a smaller or greater number of synthetic jet ejectors to achieve a similar effect.

Further details of the main body element 119 may be appreciated with respect to FIGS. 21-23. As seen therein, the main body element 119 is equipped with peripheral tabs 273 containing a plurality of protrusions 283 thereon which releasably engage the inner surface of the rails 109 (see FIG. 7), thereby securing the main body element 119 to the payload module 105. The main body element 119 is also equipped with protrusions 277 at various places throughout to ensure proper spacing and alignment between the main body element 119 and other components of the device 101. The main body element 119 is further equipped with wire conduits 281 through which the wires providing current to the synthetic jet actuators 126, 127 extend.

Figure 24:
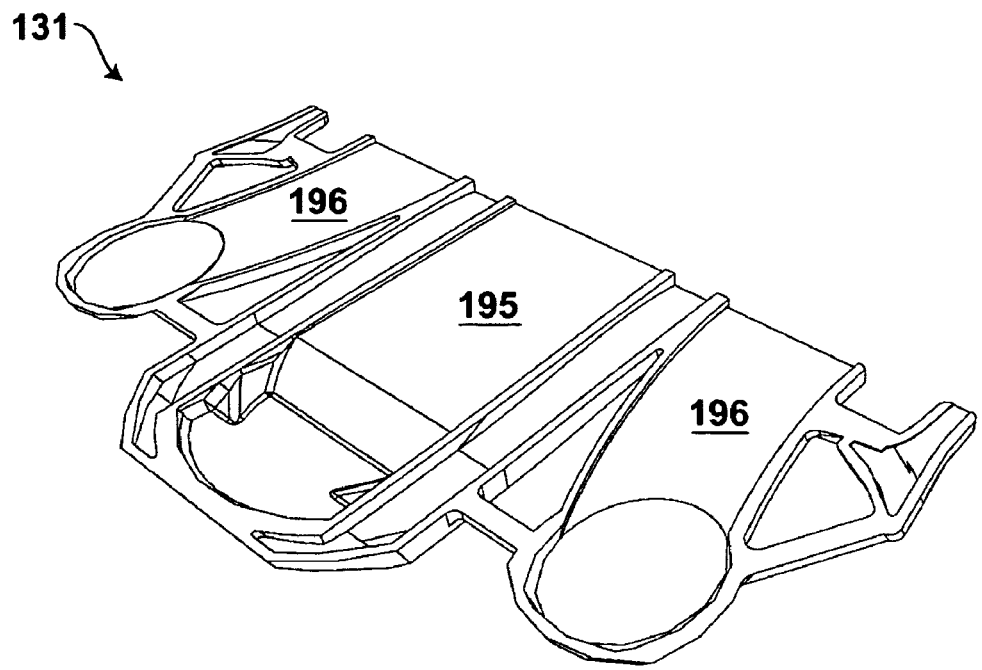
FIG. 24 is a front perspective view of the bottom housing element of the synthetic jet actuator module of FIG. 7.
Figure 25:
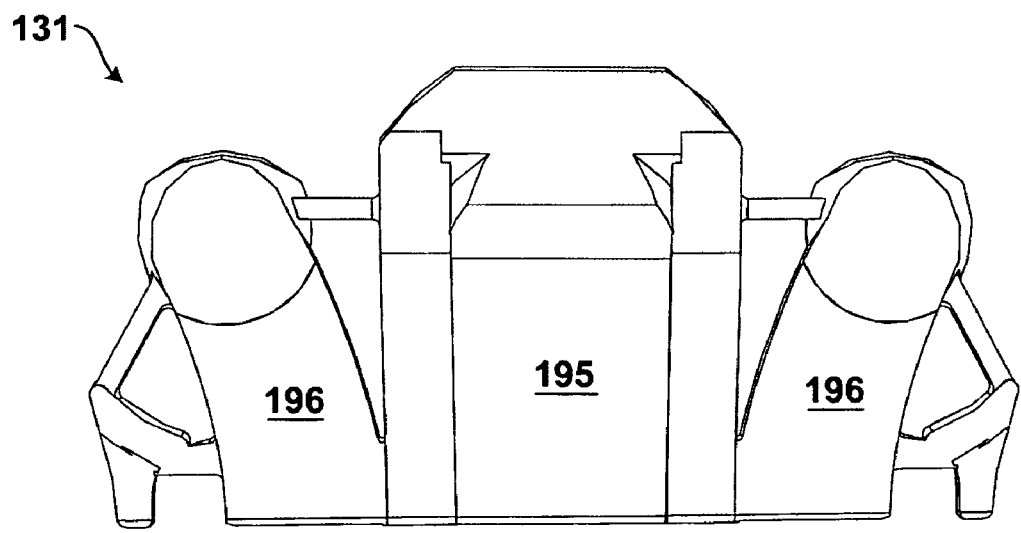
FIG. 25 is a bottom perspective view of the middle housing element of the synthetic jet actuator module of FIG. 7.
Figure 26:
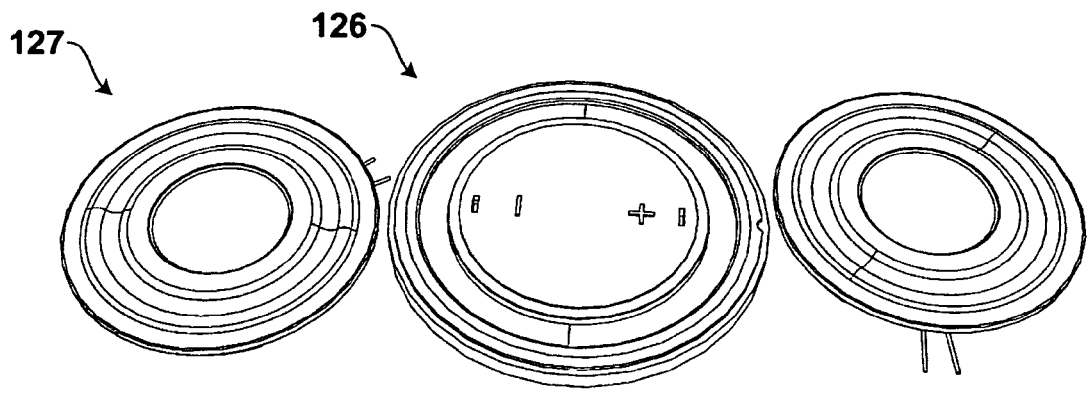
FIG. 26 is a top perspective view of a synthetic jet actuator assembly of the synthetic jet actuator module of FIG. 7.
Figure 27:
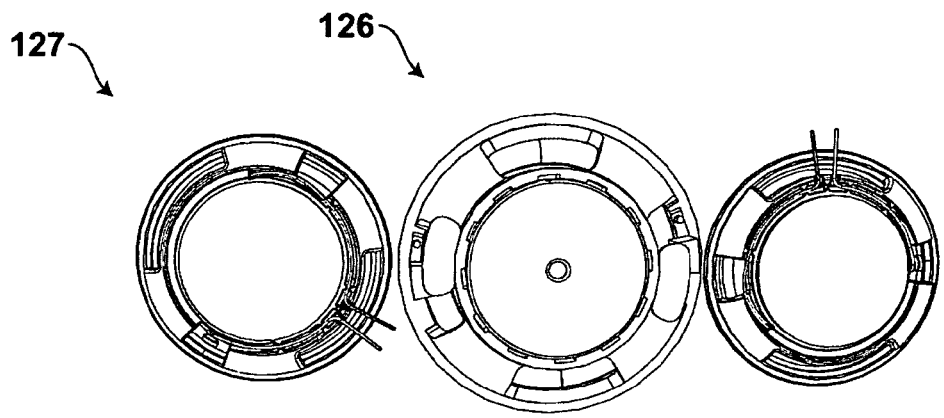
FIG. 27 is a bottom perspective view of a synthetic jet actuator assembly of the synthetic jet actuator module of FIG. 7.
Figure 28:
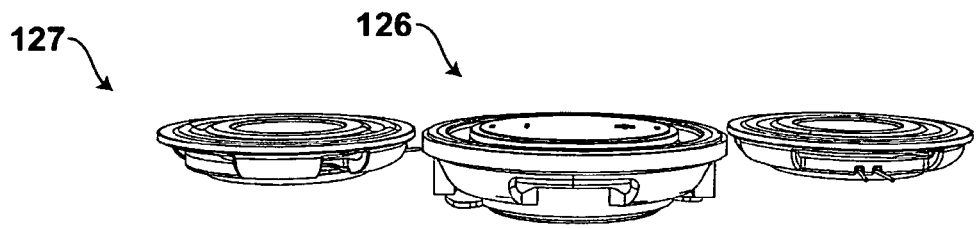
FIG. 28 is a side perspective view of a synthetic jet actuator assembly of the synthetic jet actuator module of FIG. 7.

As best seen in FIG. 23, the main body element 119 is further equipped with a central depression 191 and peripheral depressions 192. Similarly, as seen in FIGS. 24-25, the bottom body element 131 is equipped with a central depression 195 and peripheral depressions 196. When the main body element 119 and the bottom body element 131 are mated together, central depressions 191 and 195 form a central vent, and peripheral depressions 192 and 196 for peripheral vents. It will be appreciated from FIG. 7 that the central vent directs synthetic jets created by the central synthetic jet ejector 126 through the space occupied by the hard disk drive 107 and the heat sink plate 111, and the peripheral vents direct synthetic jets created by the peripheral synthetic jet ejectors 127 through the interior of the rails 109.

Figure 29:
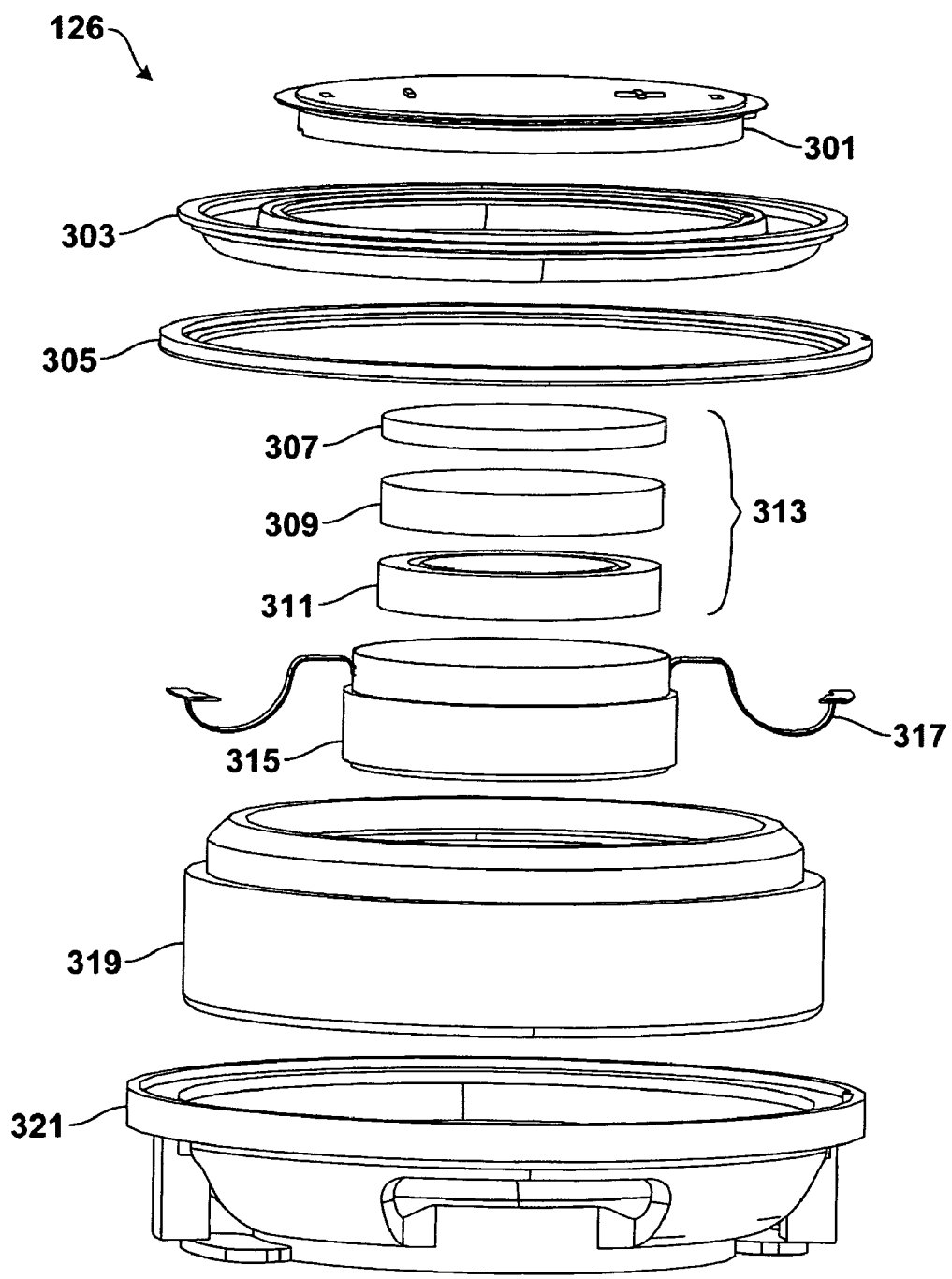
FIG. 29 is an exploded view of the synthetic jet actuator of FIG. 10.
Figure 31:
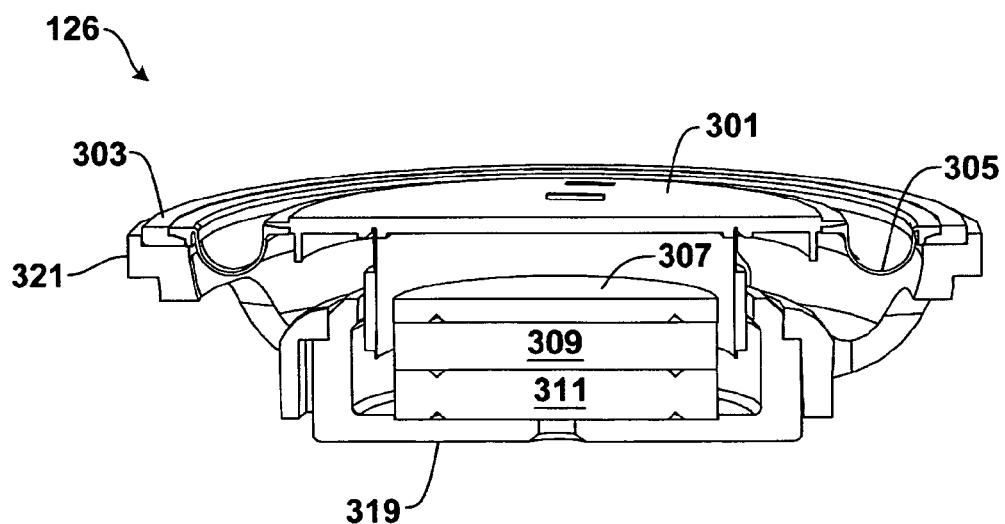
FIG. 31 is a cross-section taken along LINE 31-31 of FIG. 30.

The details of the synthetic jet actuators 126, 127 may be appreciated with respect to FIGS. 26-31. As best seen in FIGS. 29 and 31, each of the synthetic jet actuators 126, 127 is equipped with a diaphragm 301, a suspension 303, an edge seal 305, a cone assembly 313 (including cone elements 307, 309 and 311), a voice coil 315, tinsel 317, a permanent magnet 319, and a basket 321. These components are well known to the art of audio speakers, and are used in a similar fashion in the synthetic jet actuators 126, 127 described herein.

Various stroboscopes may be used to achieve temporal aliasing in the methodologies and devices described herein. Preferably, the stroboscope is a light source, such as an LED, which is capable of emitting brief and rapid flashes of light. The stroboscope may be provided with a control unit which may be manipulated by the user to adjust the frequency of the flash. In particular, the control may be manipulated to cause the frequency of the flash to be equal to, or to be an integer multiple of, the frequency at which the diaphragm of the synthetic jet actuator is vibrating, thereby causing the diaphragm to appear to be stationary. The control may also be manipulated to cause the frequency of the flash to be a unit fraction below or above the frequency (or an integer multiple thereof) at which the diaphragm of the synthetic jet actuator is vibrating, thus causing the diaphragm to appear to move at a sufficiently slow speed such that the motion of the diaphragm can be readily ascertained. Such an effect may be utilized for aesthetic or maintenance purposes.

In some embodiments, the control of the stroboscope may be governed by circuitry or logic within the device which operates the stroboscope in accordance with a predefined algorithm. This control may be in place of, or in addition to, any control provided to the user. For example, in some embodiments, such a control may operate to fluctuate the frequency of the stroboscope periodically such that the motion of the diaphragm appears to slow down, stop, and then reverse itself. In other embodiments, such a control may operate to maintain the frequency of the stroboscope at a steady rate such that deviations in the frequency at which the diaphragm is being vibrated may be readily ascertained. In still other embodiments, the frequency of the stroboscope may adjust to the frequency at which the diaphragm is being vibrated such that the diaphragm always appears stationary or always appears to move at the same speed.

Various visual or audio effects may be employed in conjunction with the devices and methodologies disclosed herein. For example, light sources of various colors, and/or or various types of optical or chromatic filters, may be employed to impart a particular color or effect to a diaphragm. Likewise, audio effects may be provided that provide, for example, a qualitative indication of the relative frequency at which the stroboscope and/or diaphragm is currently oscillating, or which indicate when the device is malfunctioning.

As a specific, non-limiting example of the foregoing effects, the diaphragm may be illuminated with a light source that tends increasingly towards the blue end of the spectrum as the frequency of the stroboscope decreases, and which tends increasingly towards the red end of the spectrum as the frequency of the stroboscope increases. If the frequency of the stroboscope in such an embodiment increases or decreases in proportion to increases or decreases in the frequency at which the diaphragm is vibrating, and if this latter frequency increases or decreases in response to the thermal load of the device, then such an embodiment may be utilized to provide a visual indication of the current thermal load of the device.

While much of the foregoing discussion has focused on the use of temporal aliasing in conjunction with a thermal management system based on synthetic jet actuators, it will be appreciated that this approach may be advantageously employed in other types of thermal management systems as well. For example, in thermal management systems based on piezoelectric actuators, temporal aliasing may be utilized to provide a visual indication of the operation of the piezoelectric membrane used in such systems. Temporal aliasing may be used to a similar effect in fan-based thermal management systems.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A device, comprising:
   a housing equipped with a window;
   a diaphragm, visible through said window;
   an actuator adapted to vibrate said diaphragm; and
   a strobe light.

2. The device of claim 1, wherein said diaphragm and said actuator are incorporated into a synthetic jet ejector.

3. The device of claim 1, wherein said strobe light illuminates said diaphragm.

4. The device of claim 1, wherein said strobe light is disposed adjacent to said viewing window.

5. The device of claim 1, wherein said strobe light is operable at an adjustable frequency.

6. The device of claim 5, wherein the frequency of said strobe light is adjustable relative to the operating frequency of the diaphragm so as to obtain a temporal aliasing effect.

7. The device of claim 1, further comprising a hard disk drive.

8. The device of claim 1, wherein said strobe light comprises an LED.

9. A device, comprising:
   a synthetic jet actuator module containing a synthetic jet actuator equipped with an actuator and a diaphragm, a window, and a strobe light; and
   a payload module comprising a rail having an interior space which is in fluidic communication with said synthetic jet actuator.

10. The device of claim 9, further comprising an electronic device disposed within said payload module.

11. The device of claim 10, wherein said electronic device is a hard disk drive.

12. The device of claim 9, wherein said payload module further comprises a cooling plate.

13. The device of claim 9, wherein said device comprises first and second rails, and wherein each of said first and second rails is attached to a side of said synthetic jet actuator module.

14. The device of claim 9, wherein said rail encloses a space having a longitudinal axis, and wherein said rail is equipped with a plurality of ridges which are essentially parallel to said longitudinal axis.

15. The device of claim 9, wherein said rail has a longitudinal axis and is equipped with a plurality of ridges disposed on an external surface thereof, and wherein said ridges are essentially parallel to said longitudinal axis.

16. The device of claim 9, further comprising a heat sink plate, and wherein said rail is equipped with a first lip adapted to be releasably fastened to a major surface of said heat sink plate.

17. The device of claim 16, wherein said rail is equipped with a second lip which is complimentary in shape to a side of said heat sink plate.

18. The device of claim 17, wherein said second lip is adapted to engage a side of said heat sink plate when said first lip is releasably fastened to said major surface of said heat sink plate.

19. The device of claim 9, wherein said synthetic jet actuator module comprises first and second groups of synthetic jet actuators, wherein the synthetic jet actuators in each of said first and second groups is equipped with a diaphragm, and wherein the combined mass of the diaphragms associated with the synthetic jet actuators in said first group is essentially equal to the combined mass of the diaphragms associated with the synthetic jet actuators in said second group.

20. The device of claim 19, wherein said first group has two members, and wherein said second group has one member.

21. The device of claim 20, wherein the actuator in the second group is centrally located in said synthetic jet actuator module.

22. The device of claim 21, wherein the actuators in the second group are essentially symmetrically disposed about the actuator of the first group.

23. The device of claim 9, wherein said synthetic jet actuator module further comprises:
   a transparent panel disposed over said synthetic jet actuator;
   a window frame, seated on said transparent panel, said window frame having an aperture in a sidewall thereof;
   a holder adapted to hold said strobe light adjacent to said aperture; and
   an opaque first exterior housing element seated on said transparent panel and having an aperture therein into which said window frame protrudes.

24. The device of claim 23, further comprising a second housing element which releasably engages said first housing element and which houses said synthetic jet actuator.

25. The device of claim 24, wherein said second housing element is equipped with a chute which is in fluidic communication with said synthetic jet ejector.

26. A device, comprising:
- a synthetic jet actuator module equipped with first and second synthetic jet ejectors having first and second diaphragms, respectively;
- a payload module comprising first and second structural elements having first and second interior spaces therein, respectively, wherein said first interior space is in fluidic communication with said first synthetic jet actuator, and wherein said second interior space is in fluidic communication with said second synthetic jet actuator;
- a transparent panel disposed over said first and second diaphragms;
- first and second window frames, seated on said transparent panel over said first and second diaphragms, respectively, wherein each of said first and second window frames has an aperture in a sidewall thereof;
- a first strobe light;
- a first holder adapted to hold said first strobe light adjacent to the aperture of said first window frame; and
- an opaque first exterior housing element seated over said transparent panel and having a first aperture therein into which said first window frame protrudes.

27. The device of claim 26, further comprising:
- a second strobe light; and
- a second holder adapted to hold said second strobe light adjacent to the aperture of said second window frame.

28. The device of claim 26, wherein said second housing element is equipped with first and second chutes, wherein said first chute is in fluidic communication with said first synthetic jet ejector and said first structural element, and wherein said second chute is in fluidic communication with said second synthetic jet ejector and said second structural element.

* * * * *